United States Patent
Lee

(10) Patent No.: US 9,484,902 B2
(45) Date of Patent: Nov. 1, 2016

(54) DELAY CIRCUIT

(71) Applicant: SK hynix Inc., Gyeonggi-do (KR)

(72) Inventor: Yo-Sep Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/796,933

(22) Filed: Jul. 10, 2015

(65) Prior Publication Data
US 2016/0142058 A1    May 19, 2016

(30) Foreign Application Priority Data
Nov. 18, 2014    (KR) .................. 10-2014-0160571

(51) Int. Cl.
H03K 5/135    (2006.01)
H03K 23/66    (2006.01)
H03K 5/00     (2006.01)

(52) U.S. Cl.
CPC ............. *H03K 5/135* (2013.01); *H03K 23/66* (2013.01); *H03K 2005/00241* (2013.01); *H03K 2005/00293* (2013.01)

(58) Field of Classification Search
CPC .. H03K 5/131; H03K 5/135; H03K 5/15033; H03K 5/1508; H03K 5/133; H03K 2005/00058; H03K 2005/00071

USPC ................ 327/261, 262, 264, 272, 274, 276
See application file for complete search history.

(56) References Cited

U.S. PATENT DOCUMENTS

| 6,037,818 A * | 3/2000 | Sato ................ G01R 31/31709 327/262 |
| 6,101,197 A * | 8/2000 | Keeth ....................... G06F 1/10 370/503 |
| 8,564,345 B2 * | 10/2013 | Yu ........................ H03L 7/0818 327/156 |
| 2006/0132210 A1 * | 6/2006 | Kong .................... H03K 5/133 327/261 |

FOREIGN PATENT DOCUMENTS

KR    1020100076504    7/2010

* cited by examiner

*Primary Examiner* — John Poos
(74) *Attorney, Agent, or Firm* — IP & T Group LLP

(57) ABSTRACT

A delay circuit may include a fine timing measurement unit suitable for measuring fine timing information on whether an input signal corresponds to the timing of any one of an even cycle or an odd cycle based on a clock, a coarse delay unit suitable for delaying the input signal whose fine timing has been measured by the fine timing measurement unit in synchronization with a frequency divided clock and outputting a delayed signal, and a fine timing application unit suitable for applying the fine timing information to the delayed signal of the coarse delay unit.

11 Claims, 6 Drawing Sheets

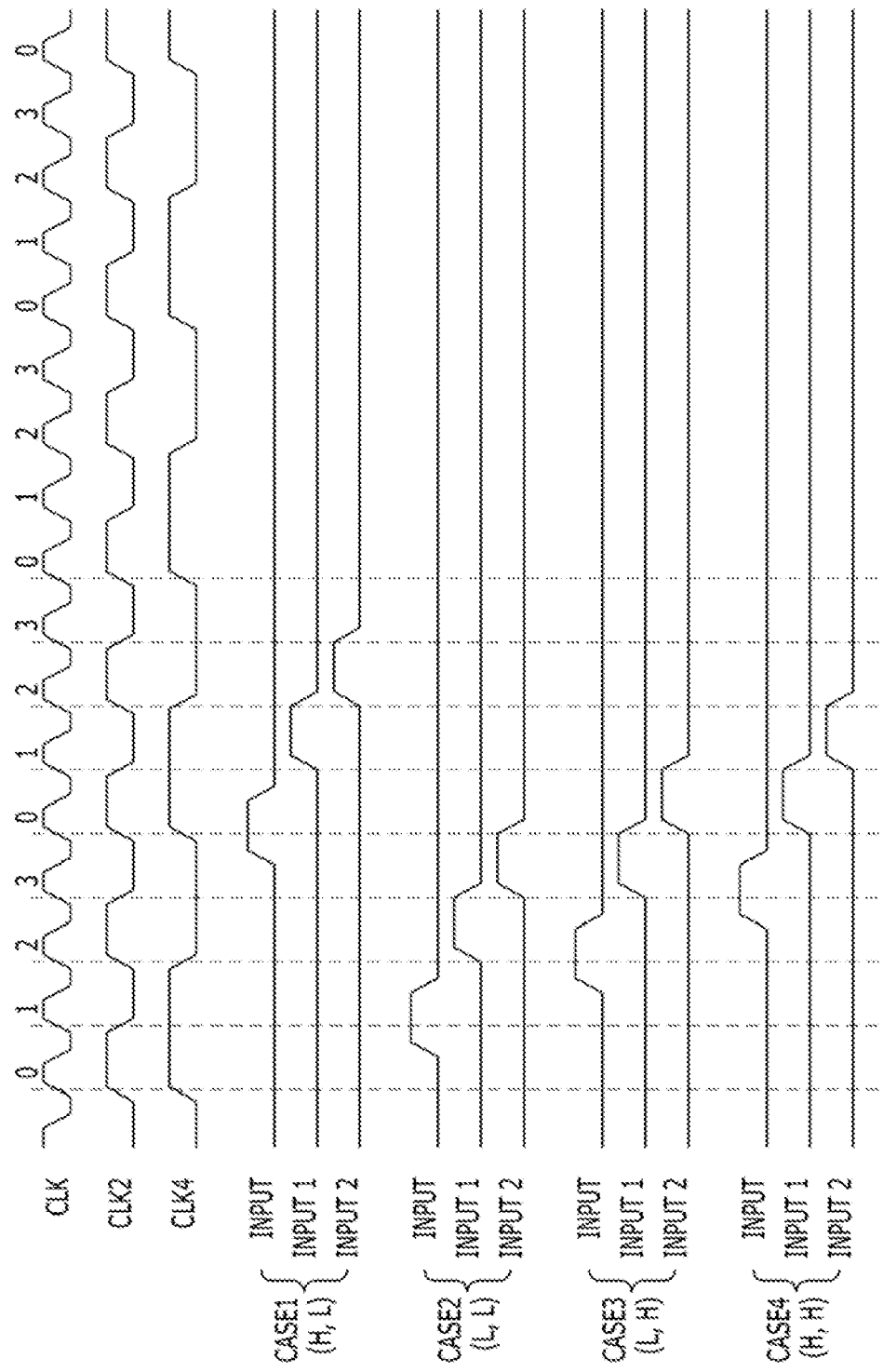

DELAY CIRCUIT

CROSS-REFERENCE TO RELATED APPLICATION(S)

The present application claims priority of Korean Patent Application No. 10-2014-0160571, filed on Nov. 18, 2014, which is incorporated herein by reference in its entirety.

BACKGROUND

1. Field

Exemplary embodiments of the present invention relate to a delay circuit and, more particularly, to a technology for increasing accuracy of a delay circuit that operates based on a clock.

2. Description of the Related Art

A delay circuit refers to a circuit that delays input signals for a certain amount of time in order to adjust timing. Semiconductor devices often need to operate in synchronization with a variety of sequences and operation timings. Therefore, delay circuits are used in many semiconductor devices.

FIG. 1 illustrates a configuration of a conventional delay circuit that operates based on a clock.

Referring to FIG. 1, the delay circuit includes shift units S0 to S40. Each of the shift units S0 to S40 shifts a signal input thereto in synchronization with a clock CLK and outputs the shifted signal. Each of the shift units S0 to S40 may be a D flip-flop that operates in synchronization with a rising edge of the clock CLK.

The shift unit S0 at the head is used to synchronize an input signal INPUT with the clock CLK, and the remaining shift units S1 to S40 are used to sequentially delay signals synchronized by the shift unit S0. The delay circuit of FIG. 1 delays the input signal INPUT by 40 clocks, i.e., 40 periods of the clock CLK, and outputs the delayed signal as an output signal OUTPUT.

FIG. 2 illustrates a configuration of a conventional delay circuit using a frequency divided clock CLK2 having the same delay value as that of FIG. 1. The frequency divided clock CLK2 has a period twice that of the clock CLK of FIG. 1, and has a frequency that is half the frequency of the clock CLK of FIG. 1.

Referring to FIG. 2, the delay circuit includes shift units S0 to S20. Each of the shift units S0 to S20 shifts a signal input thereto by one clock cycle, in synchronization with a frequency divided clock CLK2, and outputs the shifted signal.

The shift unit S0 is used to synchronize an input signal INPUT with the frequency divided clock CLK2, and the remaining shift units S1 to S20 are used to sequentially delay respective signals synchronized by the shift unit S0. The delay circuit of FIG. 2 delays the input signal INPUT by 20 clock cycles, i.e., 20 periods of the frequency divided clock CLK2, and outputs the delayed signal as an output signal OUTPUT. One period of the frequency divided clock CLK2 is twice the period of the clock CLK of FIG. 1, and thus the delay circuit of FIG. 2 delays the input signal INPUT by 40 clock cycles, based on the clock CLK of FIG. 1.

That is, the delay circuit of FIG. 2 using the frequency divided clock CLK2 includes shift units S0 to S20, which are half the number of shifts units in the delay circuit of FIG. 1, but they have the same delay value as the delay circuit of FIG. 1.

FIG. 3 is a timing diagram illustrating operations of the delay circuit of FIG. 1 and the delay circuit of FIG. 2.

Disadvantages of the delay circuit of FIG. 2 using the frequency divided clock CLK2 are described below with reference to FIG. 3.

Referring to FIG. 3, in CASE1, after the input signal INPUT is activated, the shift unit S0 synchronizes the input signal INPUT with an even cycle "e" of the clock CLK, i.e., an even-numbered activation. The delay circuit of FIG. 1 activates the output signal OUTPUT after 40 cycles of the clock CLK from when the input signal INPUT is synchronized with the even cycle "e". Likewise, the delay circuit of FIG. 2 activates the output signal OUTPUT after 40 cycles of the clock CLK, i.e., after 20 cycles of the frequency divided clock CLK2, from when the input signal INPUT is synchronized with the even cycle "e".

In CASE2, after the input signal INPUT is activated, the shift unit S0 of FIG. 1 synchronizes the input signal INPUT with an odd cycle "o" of the clock CLK, i.e., an odd-numbered activation, and the delay circuit of FIG. 1 activates the output signal OUTPUT after 40 cycles of the clock CLK from when the input signal INPUT is synchronized with the odd cycle "o". In contrast, the delay circuit of FIG. 2 activates the output signal OUTPUT after 41 cycles of the clock CLK from when the input signal INPUT is synchronized with the odd cycle "o". This is because the delay circuit of FIG. 2 operates in synchronization with the frequency divided clock CLK2, and thus the shift unit S0 of FIG. 2 synchronizes the input signal INPUT with an even cycle "e" of the clock CLK, and the delay circuit of FIG. 2 activates the output signal OUTPUT after 40 cycles of the clock CLK, i.e., after 20 cycles of the frequency divided clock CLK2, from when the input signal INPUT is synchronized with the even cycle "e".

If a delay circuit is designed using the frequency divided clock CLK2 as described above, the area of the delay circuit may be reduced, but there is a concern in that the delay circuit does not have precise timing because the sampling and delay operations of the input signal INPUT are performed using the frequency divided clock CLK2.

SUMMARY

Various embodiments are directed to a technology for reducing area of a delay circuit and also enabling a delay circuit to precisely operate using a frequency divided clock.

In an embodiment, a delay circuit may include a fine timing measurement unit suitable for measuring fine timing information on whether an input signal corresponds to the timing of any one of an even cycle or an odd cycle based on a clock, a coarse delay unit suitable for delaying an input signal whose fine timing has been measured by the fine timing measurement unit in synchronization with a frequency divided clock and outputting a delayed signal, and a fine timing application unit suitable for applying the fine timing information to the delayed signal of the coarse delay unit.

The delay circuit may further include a frequency division unit suitable for generating the frequency divided clock by dividing the frequency of the clock by 2.

The fine timing measurement unit may include a plurality of first shift units suitable for generating a first shift signal and a second shift signal by sequentially shifting the input signal in synchronization with the clock, a sampling unit suitable for generating the fine timing information by sampling the frequency divided clock in synchronization with the first shift signal, and a summation unit suitable for adding up the activation sections of the first shift signal and the second shift signal and outputting a summation signal having the added activation section as the input signal of the coarse delay unit.

The coarse delay unit may include a plurality of second shift units suitable for sequentially shifting the input signal of the coarse delay unit in synchronization with the frequency divided clock.

The fine timing application unit may include a plurality of third shift units suitable for sequentially shifting the delayed signal of the coarse delay unit in synchronization with the clock and a selection unit suitable for selecting one of the output signals of the plurality of third shift units as an output signal of the delay circuit based on the fine timing information.

Furthermore, in an embodiment, a delay circuit may include a frequency division unit suitable for generating a frequency divided clock by dividing the frequency of a clock by N, N being an integer, which is a multiple of 2 and greater than or equal to 4, a fine timing measurement unit suitable for measuring fine timing information on whether the input signal corresponds to any of the cycles K*N, K*N+1, K*N+2, . . . , and K*N+(N−1) based on the clock, K being an integer greater than or equal to 0, a coarse delay unit suitable for delaying the input signal whose fine timing has been measured by the fine timing measurement unit in synchronization with the frequency divided clock and outputting a delayed signal, and a fine timing application unit suitable for applying the fine timing information to the delayed signal of the coarse delay unit.

The fine timing measurement unit may include a plurality of first shift units suitable for generating first to $N^{th}$ shift signals by sequentially shifting the input signal in synchronization with the clock, a sampling unit suitable for generating the fine timing information by sampling the frequency divided clock in synchronization with at least two of the first to $N^{th}$ shift signals, and a summation unit suitable for adding up the activation sections of the first to $N^{th}$ shift signals and outputting a summation signal having the added activation section as the input signal of the coarse delay unit.

The coarse delay unit may include a plurality of second shift units suitable for sequentially shifting the input signal of the coarse delay unit in synchronization with the frequency divided clock.

The fine timing application unit may include a plurality of third shift units suitable for sequentially shifting the delayed signal of the coarse delay unit in synchronization with the clock and a selection unit suitable for selecting one of the output signals of the plurality of third shift units as an output signal of the delay circuit based on the fine timing information.

BRIEF DESCRIPTION OF THE DRAWINGS

FIG. 7 is a diagram illustrating an operation of the delay circuit of FIG. 6.

DETAILED DESCRIPTION

Figure 1:
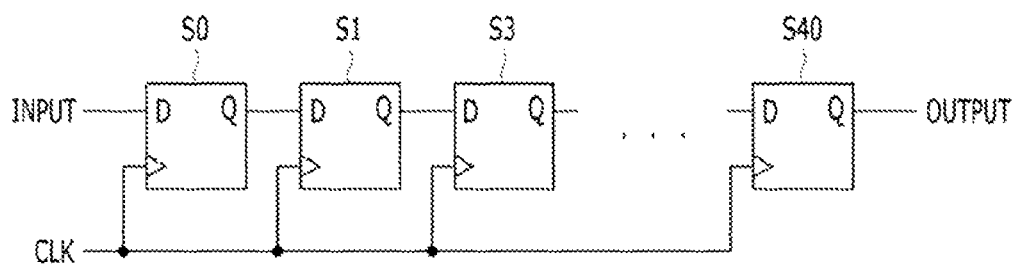
FIG. 1 illustrates a configuration of a conventional delay circuit that operates based on a clock.
Figure 2:
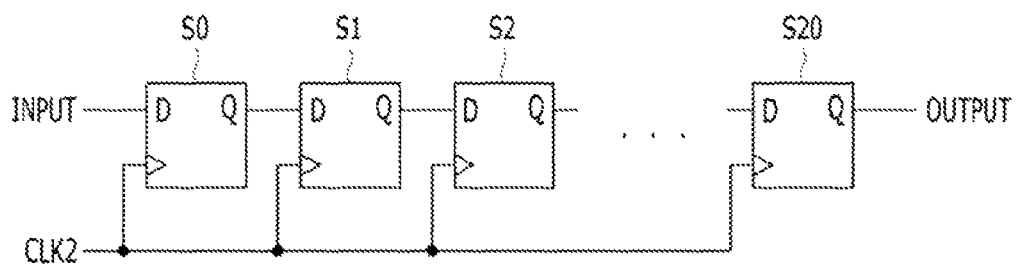
FIG. 2 illustrates a configuration of a conventional delay circuit using a frequency divided clock having the same delay value as that of FIG. 1.
Figure 3:
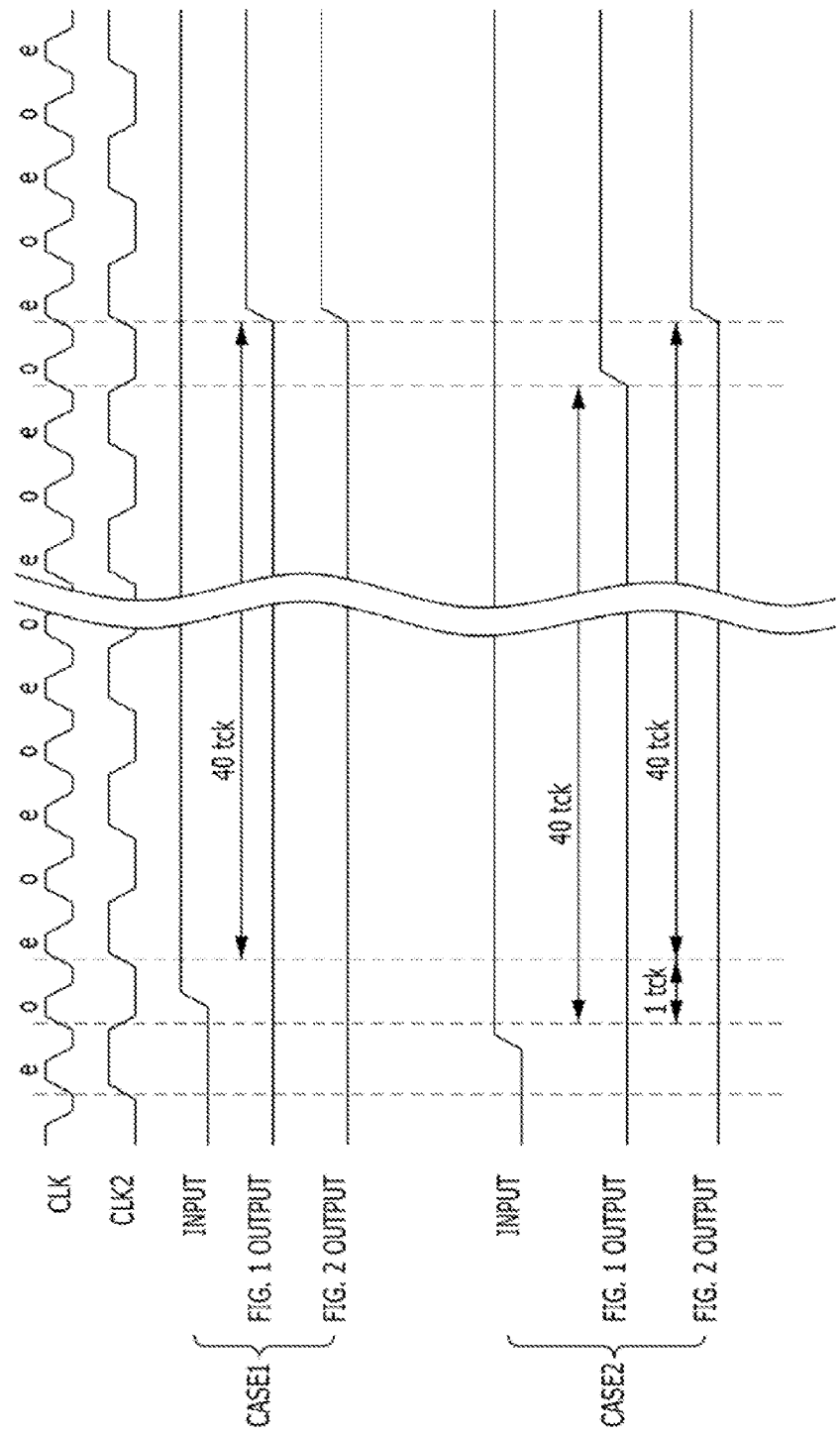
FIG. 3 is a timing diagram illustrating operations of the delay circuit of FIG. 1 and the delay circuit of FIG. 2.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

The drawings are not necessarily to scale and, in some instances, proportions may have been exaggerated in order to clearly illustrate features of the embodiments. Throughout the disclosure, like reference numerals refer to like parts of the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 4:
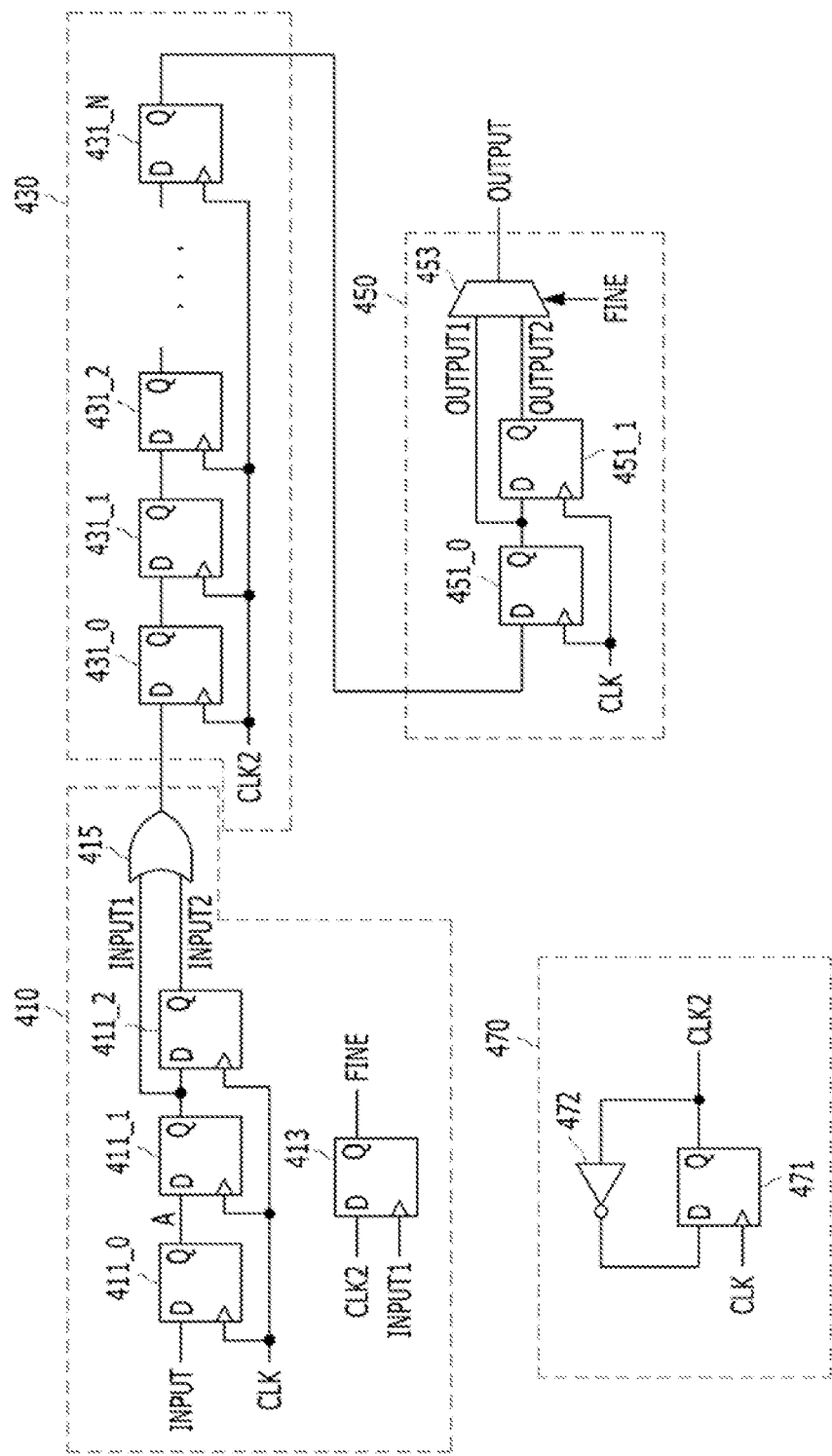
FIG. 4 illustrates a configuration of a delay circuit in accordance with an embodiment of the present invention.

FIG. 4 illustrates a configuration of a delay circuit in accordance with an embodiment of the present invention.

Referring to FIG. 4, the delay circuit may include a fine timing measurement unit 410, a coarse delay unit 430, a fine timing application unit 450, and a frequency division unit 470.

The frequency division unit 470 may generate a frequency divided clock CLK2 by dividing a clock CLK. The frequency divided clock CLK2 may have a period that is twice the period of the clock CLK, but have a frequency that is half the frequency of the clock CLK. The frequency division unit 470 may include a flip-flop 471 and an inverter 472. The flip-flop 471 may be a D flip-flop. The flip-flop 471 may operate in synchronization with the clock CLK and receive an inverted signal of the frequency divided clock CLK2 through an input terminal D. The inverter 472 may invert the frequency divided clock CLK2 outputted from an output terminal Q of the flip-flop 471, and output the inverted signal of the frequency divided clock CLK2 to the input terminal D of the flip-flop 471.

The fine timing measurement unit 410 may measure fine timing information FINE including information on whether a point of time at which an input signal INPUT is activated corresponds to an even cycle or an odd cycle on the basis of the clock CLK. The coarse delay unit 430 that operates in synchronization with the frequency divided clock CLK2 may measure the fine timing information FINE, that is, lost information. The fine timing measurement unit 410 may include first shift units 411_0, 411_1, and 411_2, a sampling unit 413, and a summation unit 415.

The first shift units 411_0, 411_1, and 411_2 may sequentially shift the input signal INPUT in synchronization with the clock CLK and generate a first shift signal INPUT1 and a second shift signal INPUT2. The first shift units 411_0, 411_1, and 411_2 may be D flip-flops. The first shift unit 411_0 may synchronize the input signal INPUT with the clock CLK. Each of the first shift units 411_1 and 411_2 may delay an output signal A of the first shift unit 411_0 by one clock period of the clock CLK.

The sampling unit 413 may generate the fine timing information FINE by sampling the frequency divided clock CLK2 in synchronization with the first shift signal INPUT1. The sampling unit 413 may be a D flip-flop for sampling the frequency divided clock CLK2 at a rising edge of the first shift signal INPUT1. The fine timing information FINE may have a logic level depending on whether the point of time at which the input signal INPUT is activated corresponds to an even cycle or an odd cycle based on the clock CLK.

The summation unit 415 may add up activation sections of the first shift signal INPUT1 and the second shift signal INPUT2 and output a summation signal having the added activation section to the coarse delay unit 430. If a width of the added section of the summation signal input to the coarse delay unit 430 is short, a malfunction may occur. The summation unit 415 may be provided to prevent malfunctions. The summation unit 415 may be an OR gate.

The coarse delay unit 430 may delay the summation signal whose fine timing has been measured by the fine timing measurement unit 410, in synchronization with the frequency divided clock CLK2. The coarse delay unit 430 operates irrespective of the fine timing because the coarse delay unit 430 operates in synchronization with the frequency divided clock CLK2. That is, the input signal INPUT may be identically treated by the coarse delay unit 430 irrespective of whether the input signal INPUT corresponds to an even cycle or an odd cycle on the basis of the clock CLK.

The coarse delay unit 430 may include a plurality of second shift units 431_0 to 431_N for sequentially shifting the summation signal inputted to the coarse delay unit 430 in synchronization with the frequency divided clock CLK2. Each of the plurality of second shift units 431_0 to 431_N may delay a corresponding input signal by one clock period of the frequency divided clock CLK2, that is, by two clock periods of the clock CLK. The number of second shift units 431_0 to 431_N included in the coarse delay unit 430 may be determined by a delay value of the delay circuit. The plurality of second shift units 431_0 to 431_N may be D flip-flops.

The fine timing application unit 450 may apply the fine timing information FINE to an output signal of the coarse delay unit 430. The input signal INPUT loses fine timing, that is, timing information that is unable to be identified by the frequency divided clock CLK2, but is able to be identified by only the clock CLK, while passing through the coarse delay unit 430. The fine timing application unit 450 applies the fine timing to the output signal of the coarse delay unit 430 again. Accordingly, the fine timing application unit 450 may output a final output signal OUTPUT of the delay circuit having the fine timing.

The fine timing application unit 450 may include third shift units 451_0 and 451_1 and a selection unit 453. The third shift units 451_0 and 451_1 may sequentially shift the output signal of the coarse delay unit 430 in synchronization with the clock CLK. Each of the third shift units 451_0 and 451_1 may be a D flip-flop that operates in synchronization with the clock CLK. The selection unit 453 may select one of first and second output signals OUTPUT1 and OUTPUT2 of the third shift units 451_0 and 451_1 as the final output signal OUTPUT of the delay circuit based on the fine timing information FINE.

The delay circuit of FIG. 4 may reduce a total area of the delay circuit by delaying the input signal INPUT using the coarse delay unit 430 that operates in response to the frequency divided clock CLK2 and may increase operation accuracy of the delay circuit because it restores the lost fine timing of the coarse delay unit 430 using the fine timing measurement unit 410 and the fine timing application unit 450.

Figure 5:
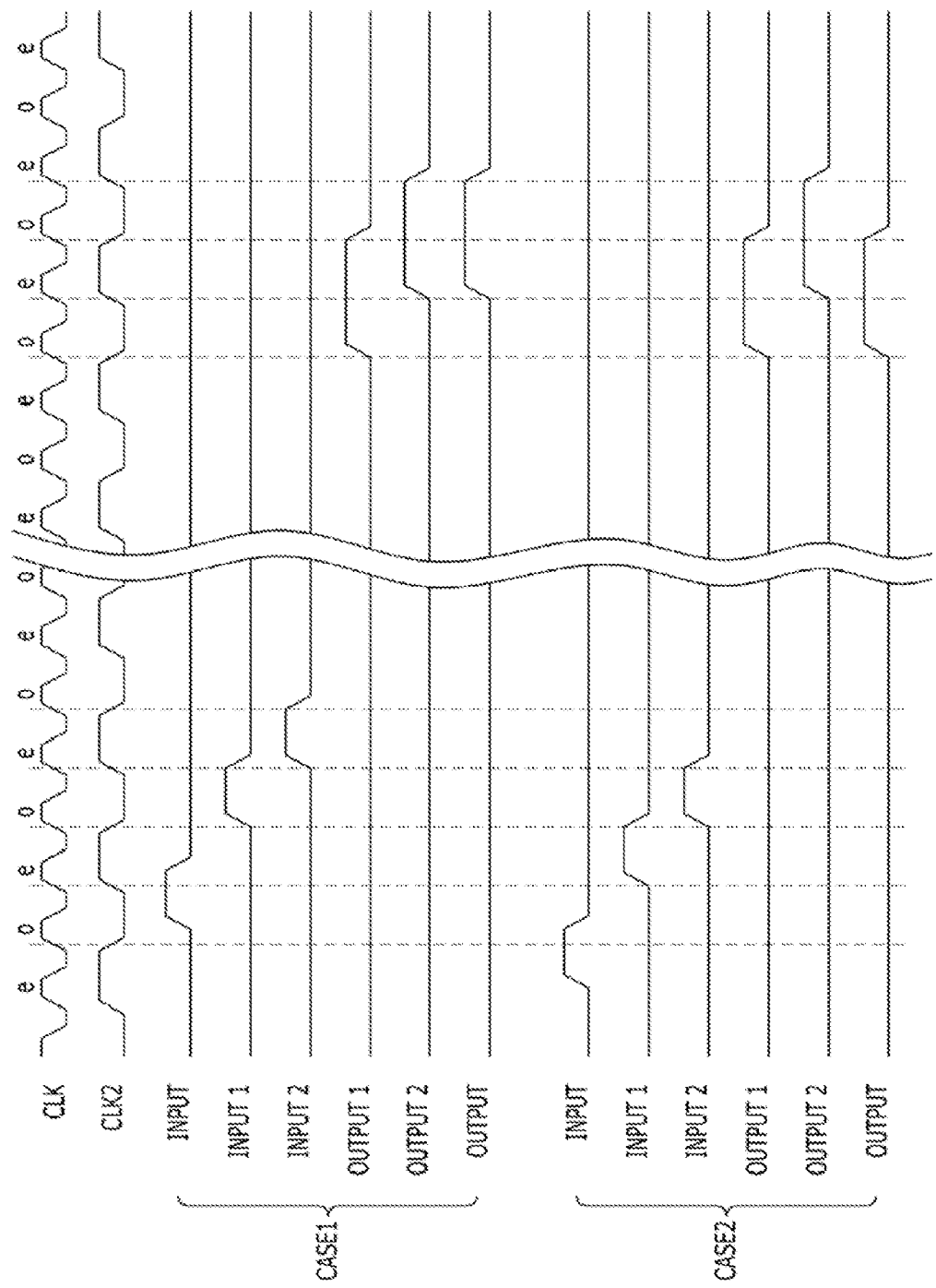
FIG. 5 is a timing diagram illustrating an operation of the delay circuit of FIG. 4.

FIG. 5 is a timing diagram illustrating an operation of the delay circuit of FIG. 4.

Referring to FIG. 5, in a first case CASE1, after the input signal INPUT is activated, the first shift unit 411_0 of the fine timing measurement unit 410 of FIG. 4 may synchronize the input signal INPUT with an even cycle "e" of the clock CLK, i.e., an even-numbered activation. Each of the first shift units 411_1 and 411_2 may delay the output signal A of the first shift unit 411_0 by one clock period of the clock CLK, and output the first shift signal INPUT1 and the second shift signal INPUT2, respectively. The sampling unit 413 of the fine timing measurement unit 410 may generate the fine timing information FINE by sampling the frequency divided clock CLK2 at the rising edge of the first shift signal INPUT1. In the first case CASE1, the fine timing information FINE of a "low" level may be generated. The selection unit 453 of the fine timing application unit 450 selects one of the first and second output signals OUTPUT1 and OUTPUT2 of the third shift units 451_0 and 451_1 as the final output signal OUTPUT of the delay circuit based on the fine timing information FINE. In the first case CASE1, the selection unit 453 may select the second output signal OUTPUT2 as the final output signal OUTPUT because the fine timing information FINE has a "low" level. As a result, from the first case CASE1, it may be seen that the final output signal OUTPUT is activated at the even cycle "e", that is, at the same fine timing as the input signal INPUT.

Referring to FIG. 5, in a second case CASE2, after the input signal INPUT is activated, the first shift unit 411_0 of the fine timing measurement unit 410 of FIG. 4 may synchronize the input signal INPUT with the odd cycle "o" of the clock CLK, i.e., an odd-numbered activation. Each of the first shift units 411_1 and 411_2 may delay the output signal A of the first shift unit 411_0 by one clock period of the clock CLK, and output the first shift signal INPUT1 and the second shift signal INPUT2, respectively. The sampling unit 413 of the fine timing measurement unit 410 may generate the fine timing information FINE by sampling the frequency divided clock CLK2 at the rising edge of the first shift signal INPUT1. In the second case CASE2, the fine timing information FINE of a "high" level may be generated. The selection unit 453 of the fine timing application unit 450 selects one of the first and second output signals OUTPUT1 and OUTPUT2 of the third shift units 451_0 and 451_1 as the final output signal OUTPUT of the delay circuit based on the fine timing information FINE. In the second case CASE2, the selection unit 453 may select the first output signal OUTPUT1 as the final output signal OUTPUT because the fine timing information FINE has a "high" level. As a result, from the second case CASE2, it may be seen that the final output signal OUTPUT is activated at the odd cycle "o", that is, at the same fine timing as the input signal INPUT.

As can be seen from FIG. 5, the final output signal OUTPUT of the delay circuit of FIG. 4 has the same fine timing as the input signal INPUT. That is, the delay circuit of FIG. 4 may not lose its fine timing while delaying the input signal INPUT using the frequency divided clock CLK2.

Figure 6:
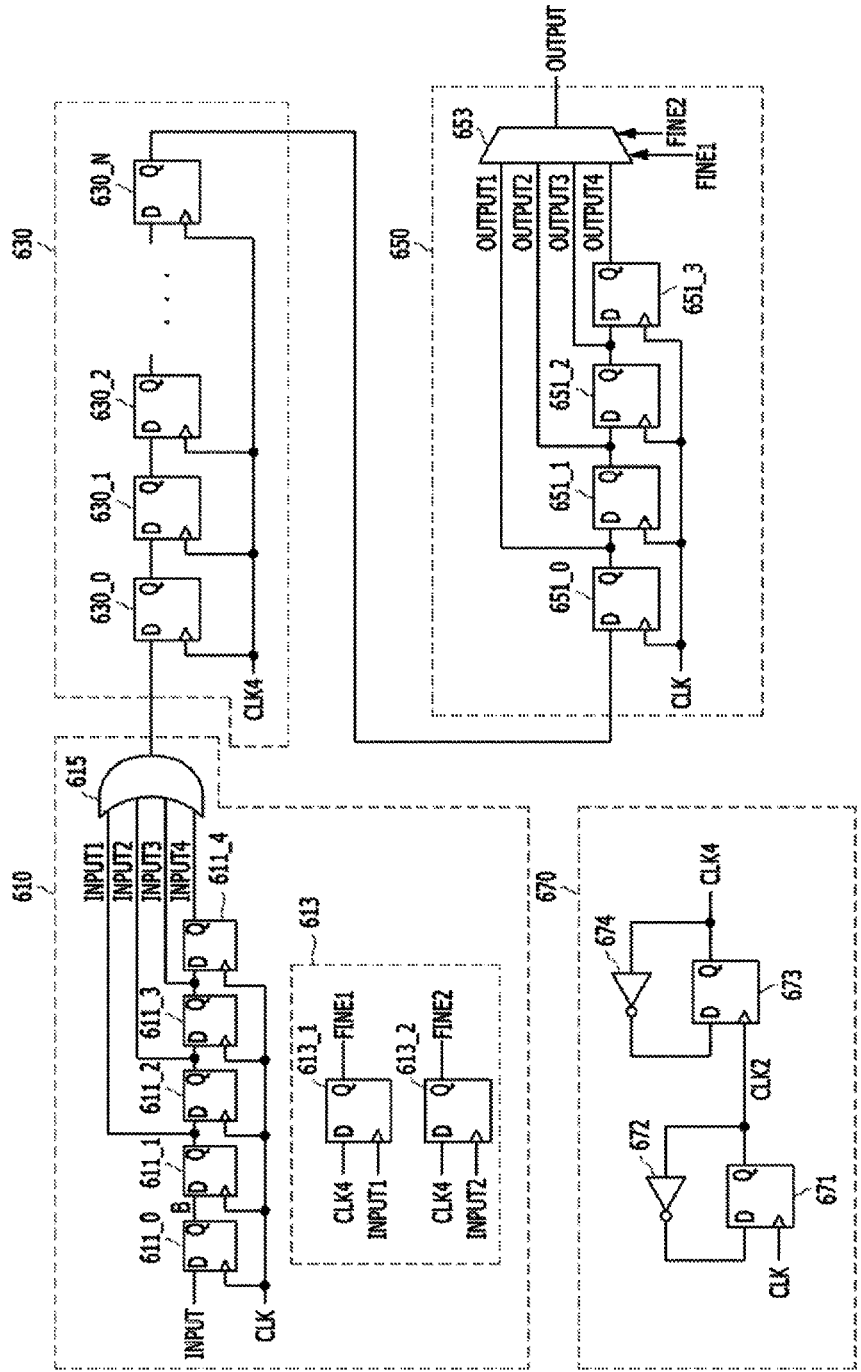
FIG. 6 illustrates a configuration of a delay circuit in accordance with another embodiment of the present invention.

FIG. 6 illustrates a configuration of a delay circuit in accordance with another embodiment of the present invention. The configuration of the delay circuit for delaying an input signal INPUT using a frequency divided clock CLK4 whose frequency has been divided by four is described below with reference to FIG. 6.

Referring to FIG. 6, the delay circuit may include a fine timing measurement unit 610, a coarse delay unit 630, a fine timing application unit 650, and a frequency division unit 670.

The frequency division unit 670 may generate the frequency divided clock CLK4 by dividing a clock CLK. The frequency divided clock CLK4 may have a period that is four times the clock CLK, and have a frequency that is ¼ of the frequency of the clock CLK. The frequency division unit 670 may have a configuration in which two frequency division units 470 of FIG. 4 are connected. The frequency division unit 670 may include a first divider and a second divider. The first divider may include a flip-flop 671 and an inverter 672 to generate a frequency divided clock CLK2 that is divided by 2 from the clock CLK, and the second divider may include a flip-flop 673 and an inverter 674 to generate the frequency divided clock CLK4 that is divided by 2 from the frequency divided clock CLK2. As a result, the frequency divided clock CLK4 may be a clock obtained by dividing the frequency of the clock CLK by 4. While it is illustrated in FIG. 6 that the frequency divided clock CLK4 is obtained by dividing the frequency of the clock CLK by 4, it is to be noted that the frequency divided clock may be obtained by dividing the frequency of the clock CLK by N, N being an integer multiple of 2 and greater than or equal to 4.

The fine timing measurement unit 610 may measure first and second fine timing information FINE1 and FINE2 regarding whether a point of time at which the input signal INPUT is activated corresponds to which one of the cycles 4K, 4K+1, 4K+2, and 4K+3, K being an integer greater than or equal than 0, on the basis of the clock CLK. This is because it is difficult to distinguish between the cycles 4K, 4K+1, 4K+2, and 4K+3 on the basis of the clock CLK using the frequency divided clock CLK4. The fine timing measurement unit 610 may include first shift units 611_0 to 611_4, a sampling unit 613, and a summation unit 615.

The first shift units 611_0 to 611_4 may sequentially shift the input signal INPUT in synchronization with the clock CLK and generate first to fourth shift signals INPUT1 to INPUT4. Each of the first shift units 611_0 to 611_4 may be a D flip-flop. The first shift unit 611_0 may synchronize the input signal INPUT with the clock CLK. Each of the first shift units 611_1 to 611_4 may delay an output signal B of the first shift unit 611_0 by one clock period of the clock CLK.

The sampling unit 613 may generate the first and second fine timing information FINE1 and FINE2 by sampling the frequency divided clock CLK4 in synchronization with the first shift signal INPUT1 and the second shift signal INPUT2. A result obtained by sampling the frequency divided clock CLK4 at a rising edge of the first shift signal INPUT1 may be the first fine timing information FINE1. A result obtained by sampling the frequency divided clock CLK4 at a rising edge of the second shift signal INPUT2 may be the second fine timing information FINE2. In the embodiment of FIG. 6, the first and second fine timing information FINE1 and FINE2 may be a signal of 2 bits because one of the four pieces of fine timing 4K, 4K+1, 4K+2, and 4K+3 needs to be identified. The sampling unit 613 may include a D flip-flop 613_1 for sampling the frequency divided clock CLK4 at the rising edge of the first shift signal INPUT1 and a D flip-flop 613_2 for sampling the frequency divided clock CLK4 at the rising edge of the second shift signal INPUT2.

The summation unit 615 may add up activation sections of the first to fourth shift signals INPUT1 to INPUT4 and output a summation signal having the added activation section to the coarse delay unit 630. If a width of the added activation section of the summation signal input to the coarse delay unit 630 is short, a malfunction may occur. The summation unit 615 may be provided in order to prevent malfunctions. The summation unit 615 may be an OR gate.

The coarse delay unit 630 may delay the summation signal whose fine timing has been measured by the fine timing measurement unit 610, in synchronization with the frequency divided clock CLK4. The coarse delay unit 630 operates in synchronization with the frequency divided clock CLK4, and thus the coarse delay unit 630 operates irrespective of the fine timing. That is, the input signal INPUT may correspond to any one of the clock cycles 4K, 4K+1, 4K+2, and 4K+3 on the basis of the clock CLK or may be identically treated by the coarse delay unit 630.

The coarse delay unit 630 may include a plurality of second shift units 631_0 to 631_N for sequentially shifting the summation signal inputted to the coarse delay unit 630 in synchronization with the frequency divided clock CLK4. Each of the plurality of second shift units 631_0 to 631_N may delay a corresponding input signal by one clock period of the frequency divided clock CLK4, that is, by four clock periods of the clock CLK. The number of second shift units 631_0 to 631_N may be determined by the delay value of the delay circuit. Each of the second shift units 631_0 to 631_N may be a D flip-flop.

The fine timing application unit 650 may apply the first and second fine timing information FINE1 and FINE2 to an output signal of the coarse delay unit 630. The input signal INPUT has its fine timing, that is, its timing information that is unable to be identified by the frequency divided clock CLK4, but is able to be identified by only the clock CLK, lost while passing through the coarse delay unit 630. The fine timing application unit 650 applies the fine timing to the output signal of the coarse delay unit 630 again. Accordingly, the fine timing application unit 650 may output a final output signal OUTPUT of the delay circuit having the fine timing.

The fine timing application unit 650 may include third shift units 651_0 to 651_3 and a selection unit 653. The third shift units 651_0 to 651_3 may sequentially shift the output signal of the coarse delay unit 630 in synchronization with the clock CLK. Each of the third shift units 651_0 to 651_3 may be a D flip-flop that operates in synchronization with the clock CLK. The selection unit 653 may select one of first to fourth output signals OUTPUT1 to OUTPUT4 of the third shift units 651_0 to 651_3 as the final output signal OUTPUT of the delay circuit in response to the first and second fine timing information FINE1 and FINE2.

The delay circuit of FIG. 6 may reduce its total area by delaying the input signal INPUT using the coarse delay unit 630 that operates in response to the frequency divided clock CLK4 and increase accuracy in the operation of the delay circuit because it restores the lost fine timing of the coarse delay unit 630 using the fine timing measurement unit 610 and the fine timing application unit 650.

FIG. 7 is a diagram illustrating an operation of the delay circuit of FIG. 6. How the first and second fine timing information FINE1 and FINE2 may be differently generated depending on the cycles 4K, 4K+1, 4K+2, and 4K+3 based on the clock CLK is described below with reference to FIG. 7.

In the clock CLK of FIG. 7, "0" may indicate that corresponding timing is 4K, "1" may indicate that corresponding timing is 4K+1, "2" may indicate that corresponding timing is 4K+2, and "3" may indicate that corresponding timing is 4K+3.

Referring to FIG. 7, in a first case CASE1, after the input signal INPUT is activated, the first shift unit 611_0 may synchronize the input signal INPUT with the timing 4K of the clock CLK. Each of the first shift units 611_1 and 611_2 may delay the output signal B of the first shift unit 611_0 by one clock period of the clock CLK, and output the first shift signal INPUT1 and the second shift signal INPUT2, respectively. The fine timing measurement unit 613 may generate the first fine timing information FINE1 of an "H" level by sampling the frequency divided clock CLK4 at the rising edge of the first shift signal INPUT1 and may generate the second fine timing information FINE2 of an "L" level by sampling the frequency divided clock CLK4 at the rising edge of the second shift signal INPUT2. Accordingly, in the first case CASE1, the first and second fine timing information FINE1 and FINE2 may be generated in the (H, L) level.

In a second case CASE2, after the input signal INPUT is activated, the first shift unit 611_0 may synchronize the input signal INPUT with the timing 4K+1 of the clock CLK. Each of the first shift units 611_1 and 611_2 may delay the output signal B of the first shift unit 611_0 by one clock period of the clock CLK, and output the first shift signal INPUT1 and the second shift signal INPUT2, respectively.

The fine timing measurement unit 613 may generate the first fine timing information FINE1 of an "L" level by sampling the frequency divided clock CLK4 at the rising edge of the first shift signal INPUT1 and may generate the second fine timing information FINE2 of an "L" level by sampling the frequency divided clock CLK4 at the rising edge of the second shift signal INPUT2. Accordingly, in the second case CASE2, the first and second fine timing information FINE1 and FINE2 may be generated in the (L, L) level.

In a third case CASE3, after the input signal INPUT is activated, the first shift unit 611_0 may synchronize the input signal INPUT with the timing 4K+2 of the clock CLK. Each of the first shift units 611_1 and 611_2 may delay the output signal B of the first shift unit 611_0 by one clock period of the clock CLK, and output the first shift signal INPUT1 and the second shift signal INPUT2, respectively. The fine timing measurement unit 613 may generate the first fine timing information FINE1 of an "L" level by sampling the frequency divided clock CLK4 at the rising edge of the first shift signal INPUT1 and may generate the second fine timing information FINE2 of an "H" level by sampling the frequency divided clock CLK4 at the rising edge of the second shift signal INPUT2. Accordingly, in the third case CASE3, the first and second fine timing information FINE1 and FINE2 may be generated in the (L, H) level.

In a fourth case CASE4, after the input signal INPUT is activated, the first shift unit 611_0 may synchronize the input signal INPUT with the timing 4K of the clock CLK. Each of the first shift units 611_1 and 611_2 may delay the output signal B of the first shift unit 611_0 by one clock period of the clock CLK, and output the first shift signal INPUT1 and the second shift signal INPUT2, respectively. The fine timing measurement unit 613 may generate the first fine timing information FINE1 of an "H" level by sampling the frequency divided clock CLK4 at the rising edge of the first shift signal INPUT1 and may generate the second fine timing information FINE2 of an "H" level by sampling the frequency divided clock CLK4 at the rising edge of the second shift signal INPUT2. Accordingly, in the fourth case CASE4, the first and second fine timing information FINE1 and FINE2 may be generated in the (H, H) level.

As can be seen from FIG. 7, the first and second fine timing information FINE1 and FINE2 are differently generated in the first to fourth cases CASE1 to CASE4. Accordingly, in the first case CASE1 to CASE4, it may be seen that the fine timing application unit 650 may select a different one of the signals OUTPUT1 to OUTPUT4 as the final output signal OUTPUT of the delay circuit.

FIGS. 4 and 5 have illustrated that the delay circuit uses the 2-frequency divided clock CLK2, and FIGS. 6 and 7 have illustrated that the delay circuit uses the 4-frequency divided clock CLK4. However, they are only examples, and the delay circuit may use a clock having a different number of frequency divisions, such as an 8-frequency divided clock or a 16-frequency divided clock. A frequency divided clock used by the delay circuit may be easily implemented by properly controlling the number of first shift units of the fine timing measurement unit 410 and 610, the number of bits of the fine timing information FINE, and the number of third shift units of the fine timing application unit 450 and 650 depending on the number of frequency division of a clock used by the delay circuit.

In accordance with the embodiments of the present invention, area may be reduced and a delay circuit that accurately operates may be designed using a frequency divided clock.

Although various embodiments have been described for illustrative purposes, it will be apparent to those skilled in the art that various changes and modifications may be made without departing from the spirit and scope of the invention as defined in the following claims.

What is claimed is:

1. A delay circuit comprising:
    a fine timing measurement unit suitable for measuring fine timing information on whether an input signal corresponds to timing of any one of an even cycle and an odd cycle based on a clock;
    a coarse delay unit suitable for delaying the input signal whose fine timing has been measured by the fine timing measurement unit in synchronization with a frequency divided clock and outputting a delayed signal; and
    a fine timing application unit suitable for applying the fine timing information to the delayed signal of the coarse delay unit,
    wherein the fine timing measurement unit comprises:
    a plurality of first shift units suitable for generating a first shift signal and a second shift signal by sequentially shifting the input signal in synchronization with the clock; and
    a sampling unit suitable for generating the fine timing information by sampling the frequency divided clock in synchronization with the first shift signal.

2. The delay circuit of claim 1, further comprising:
    a frequency division unit suitable for generating the frequency divided clock by dividing a frequency of the clock by 2.

3. The delay circuit of claim 1, wherein the fine timing measurement unit further comprises a summation unit suitable for adding up activation sections of the first shift signal and the second shift signal and outputting a summation signal having the added activation section as the input signal of the coarse delay unit.

4. A delay circuit comprising:
    a fine timing measurement unit suitable for measuring fine timing information on whether an input signal corresponds to timing of any one of an even cycle and an odd cycle based on a clock;

a coarse delay unit suitable for delaying the input signal whose fine timing has been measured by the fine timing measurement unit in synchronization with a frequency divided clock and outputting a delayed signal; and a fine timing application unit suitable for applying the fine timing information to the delayed signal of the coarse delay unit, wherein the coarse delay unit comprises a plurality of second shift units suitable for sequentially shifting the input signal of the coarse delay unit in synchronization with the frequency divided clock.

5. The delay circuit of claim 4, wherein the fine timing application unit comprises:

a plurality of third shift units suitable for sequentially shifting the delayed signal of the coarse delay unit in synchronization with the clock; and a selection unit suitable for selecting one of output signals of the plurality of third shift units as an output signal of the delay circuit based on the fine timing information.

6. A delay circuit comprising:

a frequency division unit suitable for generating a frequency divided clock by dividing a frequency of a clock by N, N being an integer multiple of 2 and greater than or equal to 4;

a fine timing measurement unit suitable for measuring fine timing information on whether an input signal corresponds to any of the cycles of K*N, K*N+1, K*N+2, . . . , and K*N+(N−1) based on the clock, K being an integer greater than or equal to 0;

a coarse delay unit suitable for delaying the input signal whose fine timing has been measured by the fine timing measurement unit in synchronization with the frequency divided clock and outputting a delayed signal; and a fine timing application unit suitable for applying the fine timing information to the delayed signal of the coarse delay unit, wherein the coarse delay unit comprises a plurality of second shift units suitable for sequentially shifting the input signal of the coarse delay unit in synchronization with the frequency divided clock.

7. The delay circuit of claim 6, wherein the frequency division unit comprises at least one flip-flop suitable for operating in synchronization with the clock and receiving an inverted signal of a signal input to an output terminal through an input terminal.

8. The delay circuit of claim 6, wherein the fine timing measurement unit comprises:

a plurality of first shift units suitable for generating first to Nth shift signals by sequentially shifting the input signal in synchronization with the clock; and a sampling unit suitable for generating the fine timing information by sampling the frequency divided clock in synchronization with at least two of the first to Nth shift signals.

9. The delay circuit of claim 8, wherein the fine timing measurement unit comprises a summation unit suitable for adding up activation sections of the first to Nth shift signals and outputting a summation signal having the added activation section as the input signal of the coarse delay unit.

10. The delay circuit of claim 6, wherein the fine timing application unit comprises:

a plurality of third shift units suitable for sequentially shifting the delayed signal of the coarse delay unit in synchronization with the clock; and a selection unit suitable for selecting one of output signals of the plurality of third shift units as an output signal of the delay circuit based on the fine timing information.

11. The delay circuit of claim 1, wherein the fine timing application unit comprises:

a plurality of third shift units suitable for sequentially shifting the delayed signal of the coarse delay unit in synchronization with the clock; and a selection unit suitable for selecting one of output signals of the plurality of third shift units as an output signal of the delay circuit based on the fine timing information.

* * * * *